(12) United States Patent
Seo et al.

(10) Patent No.: US 12,446,480 B2
(45) Date of Patent: Oct. 14, 2025

(54) TOP CONTACT ON RESISTIVE RANDOM ACCESS MEMORY

(71) Applicant: INTERNATIONAL BUSINESS MACHINES CORPORATION, Armonk, NY (US)

(72) Inventors: Soon-Cheon Seo, Glenmont, NY (US); Chanro Park, Clifton Park, NY (US); Takashi Ando, Eastchester, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 375 days.

(21) Appl. No.: 18/068,758

(22) Filed: Dec. 20, 2022

(65) Prior Publication Data

US 2024/0206352 A1   Jun. 20, 2024

(51) Int. Cl.
*H10N 70/00* (2023.01)
*H10B 63/00* (2023.01)

(52) U.S. Cl.
CPC ......... *H10N 70/8833* (2023.02); *H10B 63/80* (2023.02); *H10N 70/023* (2023.02); *H10N 70/026* (2023.02); *H10N 70/063* (2023.02); *H10N 70/066* (2023.02); *H10N 70/841* (2023.02)

(58) Field of Classification Search
CPC .......................... H10N 70/826; H10N 70/841
See application file for complete search history.

(56) References Cited

U.S. PATENT DOCUMENTS

| | | |
|---|---|---|
| 7,728,352 B2 | 6/2010 | Dennison |
| 7,935,594 B2 | 5/2011 | Schricker et al. |
| 8,345,463 B2 | 1/2013 | Lee et al. |
| 9,425,391 B1 | 8/2016 | Lai et al. |
| 9,601,545 B1 | 3/2017 | Tu et al. |
| 9,728,583 B2 | 8/2017 | Nagel et al. |
| 10,164,182 B1 | 12/2018 | Trinh et al. |

(Continued)

FOREIGN PATENT DOCUMENTS

| | | |
|---|---|---|
| CN | 104518085 A | 4/2015 |
| CN | 112310084 A | 2/2021 |

(Continued)

OTHER PUBLICATIONS

International Search Report from PCT/CN2023/134342 dated Feb. 21, 2024. (8 pages).

(Continued)

*Primary Examiner* — Mark V Prenty
(74) *Attorney, Agent, or Firm* — Tutunjian & Bitetto, P.C.; Yuanmin Cai

(57) ABSTRACT

A memory device including a trench to a first electrically conductive structure; a first electrode of a conformal electrically conductive material contained within the trench in electrical communication with the first electrically conductive structure and is present on sidewalls of the trench; a switching layer is present in the trench on the first electrode and extends outside the trench; and a second electrode present on the switching layer overfilling the trench. The memory device also includes a contact positioned on a portion of the second electrode that is overfilling the trench to provide that the contact is horizontally offset from the first electrode that is present in the trench.

12 Claims, 6 Drawing Sheets

(56) References Cited

U.S. PATENT DOCUMENTS

| | | | |
|---|---|---|---|
| 10,199,575 | B2 | 2/2019 | Chang et al. |
| 10,361,368 | B2 | 7/2019 | Ando et al. |
| 10,439,134 | B2 * | 10/2019 | Majhi ................. H10N 70/821 |
| 11,800,720 | B2 | 10/2023 | Chen et al. |
| 2008/0247214 | A1 | 10/2008 | Ufert et al. |
| 2016/0064391 | A1 | 3/2016 | Li et al. |
| 2020/0127189 | A1 | 4/2020 | Liao et al. |
| 2024/0021700 | A1 | 1/2024 | Wei et al. |

FOREIGN PATENT DOCUMENTS

| | | |
|---|---|---|
| CN | 114665013 A | 6/2022 |
| CN | 115148740 A | 10/2022 |
| CN | 120345400 A | 7/2025 |
| WO | 2024/131449 A1 | 6/2024 |

OTHER PUBLICATIONS

BrightSky et al., "Crystalline-as-Deposited ALD Phase Change Material Confined PCM Cell for High Density Storage Class Memory", In2015 IEEE International Electron Devices Meeting (IEDM) Dec. 7, 2015 (pp. 3-6).

\* cited by examiner

TOP CONTACT ON RESISTIVE RANDOM ACCESS MEMORY

BACKGROUND

The present invention relates generally to memory devices and, in particular, to a resistive switching memory stack integrated with field effect transistors.

One example of non-volatile memory uses variable resistance memory elements that can be set to either low or high resistance states, and can remain in that state until subsequently reset to an initial condition. The variable resistance memory elements are individually connected between two orthogonally extending conductors (e.g., bit and word lines) where they cross each other in a two-dimensional array. The state of such a memory element is usually changed by proper voltages being placed on the intersecting conductors.

It has been determined that the resistive memory stack is relatively thin. For example, the resistive memory stack may have a thickness ranging from 30 nm to 50 nm, which can be prone to excessive plasma damage during top contact formation. Further, the resistive memory device includes a thin bottom electrode. The thin bottom electrode of the resistive random access memory device can include a hillock, i.e., a small raised portion, that touches the switching layer of the resistive memory stack. The presence of the hillock contacting the switching element of the memory stack degrades device performance. Further, when the bottom electrode is composed of copper, the presence of the hillock of copper can led to copper contamination downstream of the memory stack, where the memory stack is not covering the hillock.

SUMMARY

In some embodiments, the aforementioned difficulties can be overcome with a method and structure that forms a top contact on a damascene processed resistive random access memory stack (RRAM), in which the top contact is horizontally offset from the main switching area of the device. The hillock, e.g., copper hillock, from the lower electrode of prior designs can cause shorts to the resistive random access memory (RRAM) device. The damascene processed resistive random access memory device with the top trench for the top electrode being horizontally offset from the switching element, and the lower electrode, avoids the potential of shorting originating from a potential hillock. By being offset, the top electrode may be referred to being positioned on a side of the switching element of the resistive random access memory (RRAM) device. The methods described herein allow for patterning a large top electrode that allows for a fully landed top contact, which is advantageous for back end of the line (BEOL) processing. The damascene formed resistive random access memory (RRAM) device allows for a larger area of the switching layer. For example, while the lower electrode is contained within the trenches formed by the damascene method, the switching layer is not only present in the trench with the lower electrode, but also extends outside the trench, e.g., the switching layer having a greater width than the lower electrode. The extended resistive random access memory (RRAM) area for the top contact landing away from the main switching region avoids plasma damages that results from device processing of resistive random access memory devices prior to the methods and structures of the present disclosure.

According to one aspect of the present invention, a memory device, e.g., resistive random access memory (RRAM), is described including a top contact that is horizontally offset from the switching element of the device. In one embodiment, the memory device includes a trench to a first electrically conductive structure. A first electrode of a conformal electrically conductive material contained within the trench in electrical communication with the first electrically conductive structure and is present on sidewalls of the trench. A switching layer is present in the trench on the first electrode and extends outside the trench. A second electrode is present on the switching layer overfilling the trench. A contact is positioned on a portion of the second electrode that is overfilling the trench to provide that the contact is horizontally offset from the first electrode that is present in the trench.

In another embodiment, a memory device, e.g., resistive random access memory (ReRAM), is described including a top contact that is horizontally offset from the switching element of the device, in which the first electrode may be deposited to be present at the base of the trench, yet not extend along an entirety of the sidewall of the trench. In one example, the memory device includes a trench to a first electrically conductive structure. A first electrode of an electrically conductive material is present at a base of the trench in electrical communication with the first electrically conductive structure. A switching layer of a conformal material is present on the trench on the first electrode, present on sidewalls of the trench and extends outside the trench. A second electrode is present on the switching layer overfilling the trench. A contact is positioned on a portion of the second electrode that is overfilling the trench to provide that the contact is horizontally offset from the first electrode that is present in the trench.

In another aspect, a method of forming a memory device is provided. The method includes forming a trench to an electrically conductive structure that is present at a base of the trench. Forming a first electrode within the trench. Filling the trench with a fill including a bilayer comprising of a switching layer that is present on the first electrode and a layer for a second electrode on the switching layer, wherein a portion of the bilayer extends outside of the trench. Patterning a portion of the bilayer that extends outside the trench to provide a landing spot that is horizontally offset from the first electrode in the trench. Forming a contact to the landing spot.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
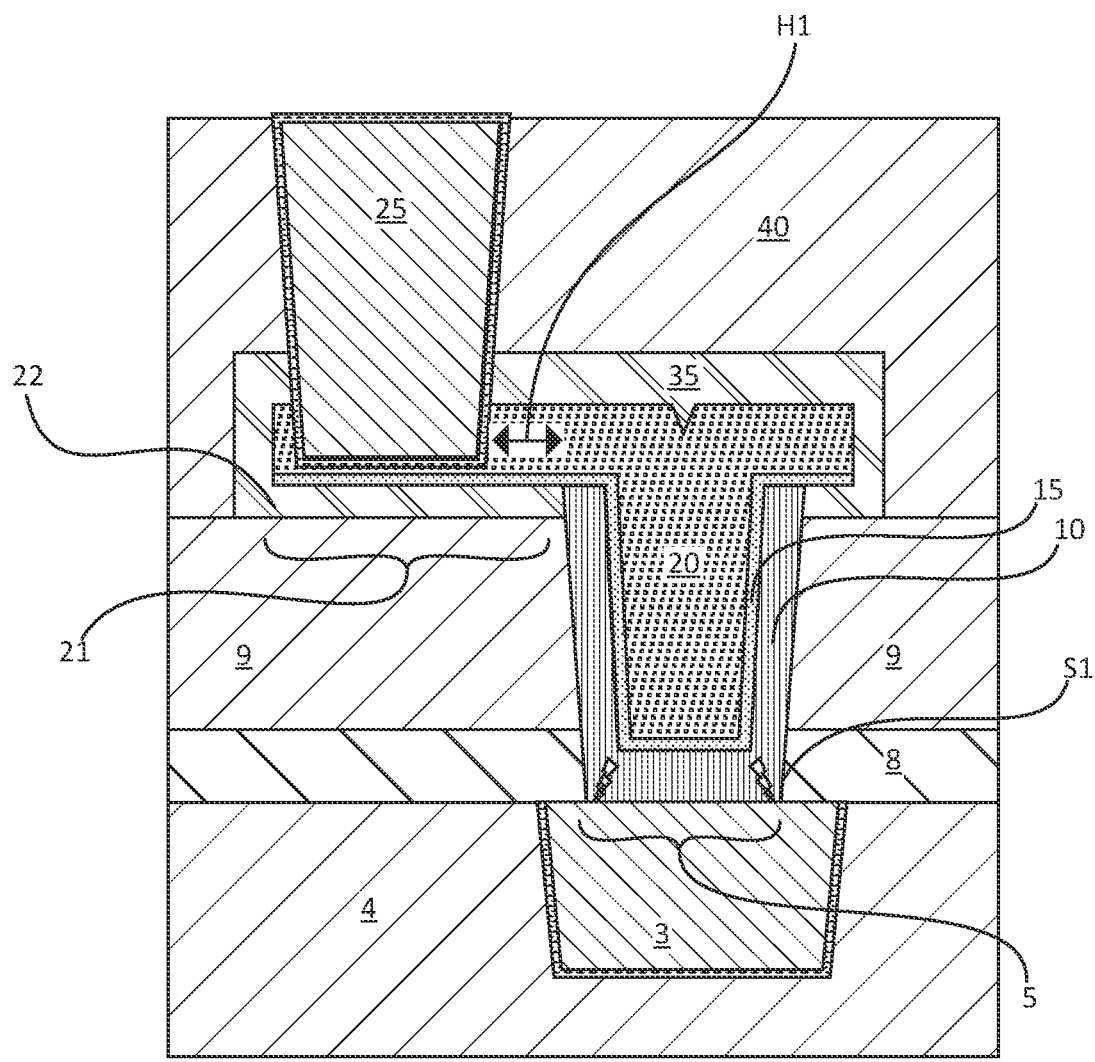
FIG. 1 is a side cross-sectional view of a resistive random access memory device, in which the lower electrode of the device is confined within a trench that is formed using a damascene process, and an upper electrode that includes a landing portion for a contact that extends outside the trench, which provides that the contact to the second electrode is horizontally offset from the first electrode, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to a resistive memory devices, e.g., resistive random access memory (RRAM). As used herein, the term "memory device" means a structure in which the electrical state can be altered and then retained in the altered state, in this way a bit of information can be stored. Resistive random-access memory (ReRAM or RRAM) is a type of non-volatile (NV) random-access (RAM) computer memory that works by changing the resistance across a dielectric solid-state material, often referred to as a memristor. Resistive random access memory (ReRAM) devices can be suitable for applications, such as a non-volatile memory, and for use in low voltage, high endurance and high density applications. ReRAM is also suitable for cross-bar arrays in neuromorphic applications.

Resistive random access memory (RRAM) can be based on the reversible formation/disruption of a conductive filament in a resistive layer providing a low- and a high-resistance states. Various classifications exist. Depending on the filament composition, two types of RRAM can be distinguished: OXRAM, where the filament is based on oxygen vacancies, and conductive bridging RAM (CBRAM), where the filament results from the dissolution of an active electrode, that can be made of silver (Ag) or copper (Cu) in most cases.

It has been determined that resistive memory stack are relatively thin. For example, the resistive memory stack may having a thickness ranging from 30 nm to 50 nm, which can be prone to excessive plasma damage during top contact formation, which can lead to unintentional forming devices, e.g., parasitic devices. The thin bottom electrode may include a hillock, e.g., a hillock composed of copper, in which the hillock can touch the switching layer and degrade device performance. Further the presence of the hillock can be the source of contamination, e.g., copper contamination when the hillock is composed of copper, when the memory stack does not cover the entirety of the hillock.

The methods and structures described herein can overcome the aforementioned difficulties with a damascene resistive random access memory device (RRAM) device including a bottom electrode confined within the damascene trench. "Damascene" is a method by which metal, e.g., copper (Cu), interconnects and wiring is formed. In a damascene method, a dielectric layer is patterned and etched to provide a trench, which is then filled with the electrically conductive material to provide the electrically conductive wiring and/or interconnects.

Following the fill, a planarization process, e.g., chemical mechanical planarization (CMP), is performed to remove any material that overfills the trench. That process is the formation of metal line/metal via using a damascene process, e.g., single damascene. Dual damascene refers to two features being formed using a damascene methodology. The dual-damascene process is characterized by patterning the vias and trenches, in such a way that the metal deposition fills both at the same time. Damascene processes generally form and fill a single feature with copper per Damascene stage. Dual-Damascene processes generally form and fill two features with copper at once, e.g., a trench overlying a via may both be filled with a single copper deposition using dual-damascene.

As will be illustrated below, by confining the bottom electrode (referred to herein as first electrode) within the tall damascene trench, the electrode does not extend outside the trench, and by forming the contact to an extension of material for the upper electrode (referred to herein as second electrode), the methods and structures described herein eliminate the possibility of shorting between these electrically conductive structures, e.g. top and bottom contacts. Additionally, the tall trench damascene RRAM described herein can also provide advantages, such as a wider area of switching providing low forming voltage, a more forgiving area for landing the top contact, and the ability for the top contact to land off center of the bottom active RRAM are in order to avoid over-etching. The structures and methods of the present invention are now discussed with greater detail with reference to FIGS. 1-12.

FIG. 1 illustrates one embodiment of a resistive random access memory device, in which the lower electrode (hereafter referred to as first electrode 10) of the device is confined within a trench 5 that is formed using a damascene process, and an upper electrode (hereafter referred to as second electrode 20) that includes a landing portion 21 for a contact 25 that extends outside the trench 5, which provides that the contact 25 to the second electrode 20 is horizontally offset H1 from the first electrode 10. The structure depicted in FIG. 1 illustrates one embodiment of a memory device, e.g., resistive random access memory (RRAM), is described including a top contact 20 that is horizontally offset H1 from the switching element of the device. The bounds of the switching element in the embodiment illustrated in FIG. 1 is defined by the presence of the first electrode 10.

In one embodiment, the memory device includes a trench 5 to a first electrically conductive structure 3. The first electrically conductive structure 3 may be an electrically conductive line, e.g., metal line, such as copper (Cu) line, or the first electrically conductive structure 3 may be a metal via, e.g., copper via. The first electrically conductive structure 3 may be present in a dielectric material 4, e.g., a dielectric substrate or dielectric interlevel layer. In some examples, the dielectric material 4 may be provided by a semiconductor material that has not been doped in a manner that causes it to be electrically conductive, e.g., a substrate of undoped silicon.

Still referring to FIG. 1, a first electrode 10 of a conformal electrically conductive material can be contained within the trench 5, in which the first electrode 10 in electrical communication with the first electrically conductive structure 3. In some embodiments, the first electrode has a U-shaped geometry when viewed from a side cross-section. The trench 5 may be present extending into an interlevel dielectric layer 9, e.g., through the interlevel dielectric layer 9. The interlevel dielectric layer 9 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H).

In some embodiments, a barrier layer and/or etch stop layer (collectively referred to as interface layer 8) may be present between the interlevel dielectric layer 9 and the underlying level of the dielectric material 4 and electrically conductive structure 3. In some embodiments, the barrier layer may include a composition that serves as a barrier to the diffusion of copper (Cu), e.g., a metal nitride, such as tantalum nitride. Etch stop layers provide for individual processing of specific material layers. On example of an etch stop layer composition is silicon nitride.

The trench 5 may extend through both the interlevel dielectric layer 9 and the interface layer 8, wherein the trench exposes the upper surface of the electrically conductive structure 3.

The first electrode 10 may be composed of one or more metal nitride material layers. For example, the first electrode 10 may be composed of a metal nitride, such as titanium nitride (TiN), tantalum nitride (TaN), tungsten nitride (WN) or combinations thereof. In other embodiments, the first electrode 10 may be a multilayered structure including metal nitride layer and aluminum containing layers. For example, the first electrode 10 may also include an aluminum containing alloy layer, e.g., titanium aluminum carbide (TiAlC).

In one example, the first electrode 10 is composed of tantalum nitride (TaN) that is deposited using physical vapor deposition (PVD), or the first electrode 10 is composed of titanium nitride (TiN) that is deposited using chemical vapor deposition (CVD)

The first electrode 10 may be present at the base of the trench 5 and may also be present on the sidewalls S1 of the trench 5. The first electrode 10 may extend along an entire height of the sidewalls S1 of the trench. However, the first electrode 10 is confined within the trench 5, and does not extend from the interior of the trench 5.

The thickness of the material layer for the first electrode 10 is substantially the same on the sidewalls S1 of the trench 5 as it is at the base of the trench. In some embodiments, the first electrode 10 has a conformal thickness. The term "conformal" denotes a layer having a thickness that does not deviate from greater than or less than 30% of an average value for the thickness of the layer.

Referring to FIG. 1, the switching layer 15 of the memory device 100a is also present within the trench 5 and is present on the first electrode 10. In some embodiments, the switching layer 15 may be a metal oxide. The metal oxide that provides the switching layer 15 may be one of hafnium oxide (HfOx), tantalum oxide (TaOx), titanium oxide (TiOx), and combinations thereof.

In the embodiment depicted in FIG. 1, the switching layer 15 is present on the base of the trench 5 atop the portion of the first electrode 10 that is present at the base of the trench 5, and the switching layer 15 is present along an entire height of the trench 5 on the portion of the first electrode 10 that is present on the sidewall S1 of the trench 5. The switching layer 15 is also present on the upper surface of the dielectric layer that provides the planarization stop layer/barrier layer 22.

The upper electrode 20 of the resistive random access memory device is also present within the contact. The upper electrode 20 may be a material layer that has a conformal thickness and is present in direct contact with the switching layer at the base and the sidewalls of the contact via. The upper electrode 20 includes a portion that extends outside of the trench, which is an extension portion 21.

In the embodiment depicted in FIG. 1, the extension portion 21 of the upper electrode is present over the upper surface of a diffusion barrier layer 22 that is present on the upper surface of the interlevel dielectric layer 9 that the trench 5 is formed through. In one embodiment, the extension portion 21 of the upper electrode 20 (also referred to as second electrode 20) is present in direct contact with a portion of the switching layer 15 (extension portion of the switching layer 15) that extends from the portion of the switching layer 15 that is present on the sidewall S1 of the trench 5.

The diffusion barrier layer 22 has a composition that can function to obstruct the diffusion of metal elements from the conductive features that fill the trenches for the metal lines and vias. For example, the diffusion barrier layer 22 may serve as a barrier to the diffusion of copper (Cu). In one example, the diffusion barrier layer 22 may be composed of but not limited to a silicon nitride SiNCH or SiCN.

The extension portion 21 of the switching layer 15 is in direct contact with upper surface of the diffusion barrier layer 22 that is present on the upper surface of the interlevel dielectric layer 9 that the trench 5 is formed through. In the embodiments depicted in FIG. 1, the outermost edge of the extension portion 21 of the upper electrode 20 (second electrode 20) is aligned to the outmost edge of the extension portion 21 of the switching layer 15.

The extension portion 21 includes the landing site for the upper contact 25. The landing site is horizontally offset H1 from the switching portion of the device. The width of the switching portion of the device is defined by the outermost edges of the first electrode 10 (i.e., lower electrode) that is present on the sidewalls S1 of the trench 5. The horizontal offset H1 is measured from the outside edge of the closest portions of the first electrode portion (first electrode 10) that is present on the sidewall S1 of the trench 5 and the closest edge of the upper contact 25 that is closest to the trench 5.

Still referring to FIG. 1, a contact 25 is positioned on the portion of the second electrode 20 (also referred to as upper electrode) that is overfilling the trench 5 to provide that the contact is horizontally offset from the first electrode 10 (also referred to as lower electrode) that is present in the trench 5. The contact 25 may be a metal via contact, and it may be composed of copper (Cu). However, other metals such as tungsten or aluminum (Al) are also possible.

The device structure depicted in FIG. 1 illustrates a top contact, i.e., contact 25, that is present on a damascene processed resistive random access memory stack (RRAM), in which the top contact is horizontally offset H1 from the main switching area of the device. The damascene processed resistive random access memory device with the top contact 25 for the top electrode (second electrode 20) being horizontally offset H1 from the switching element which avoid contacting lower electrode 10 through switching layer 15. The lower electrode (first electrode 10) which is formed within a tall trench, avoids the potential of shorting originating from a Cu hillock from bottom contact 3. By being offset, the top electrode may be referred to being positioned on a side of the switching element of the resistive random access memory (RRAM) device.

Figure 2:
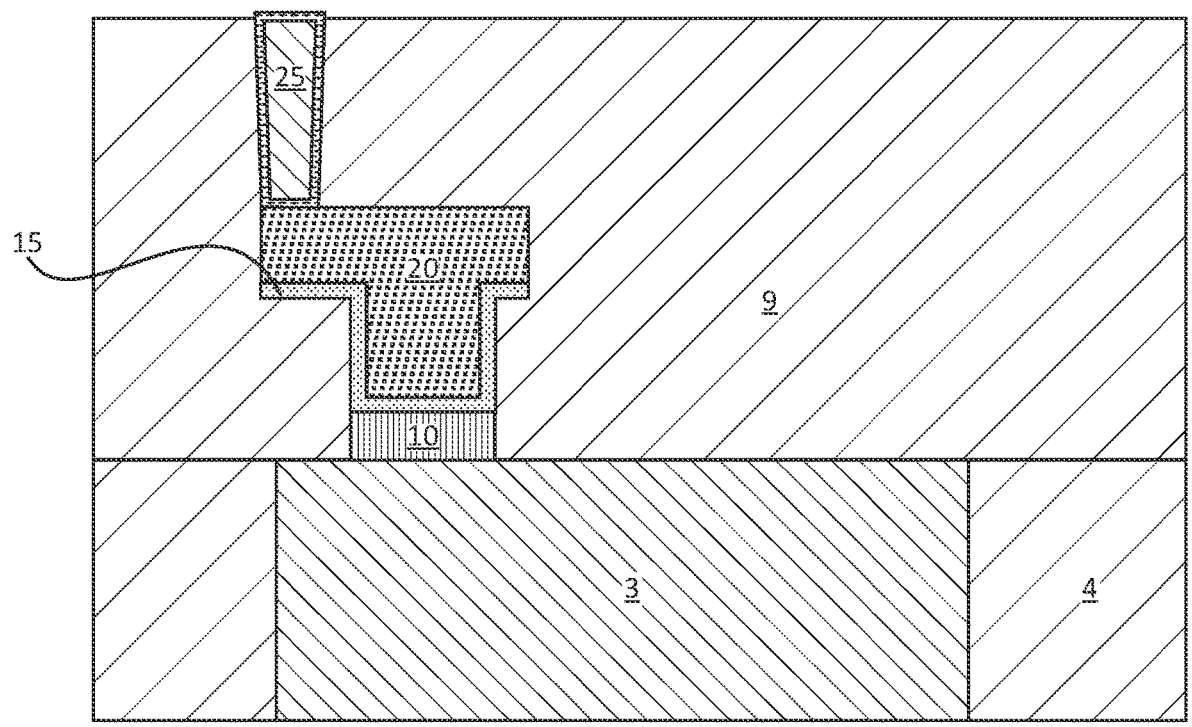
FIG. 2 is a side cross-sectional view of a second embodiment of the present invention, in which a memory device, e.g., resistive random access memory (ReRAM), is depicted including a top contact that is horizontally offset from the switching element of the device, wherein the first electrode may be deposited to be present at the base of the trench, yet not extend along an entirety of the sidewall of the trench.

FIG. 2 illustrates a second embodiment of the present invention. In the embodiment that is depicted in FIG. 2. a memory device, e.g., resistive random access memory (ReRAM), including a top contact 25 that is horizontally offset H1 from the switching element of the device. The switching element is defined by the location of the first electrode 10 (also referred to as bottom or lower electrode). In the embodiment depicted in FIG. 2, the first electrode 10 may be deposited to be present at the base of the trench, yet not extend along an entirety of the sidewall of the trench. In one example, the memory device includes a trench to a first electrically conductive structure 3. A first electrode 10 of an electrically conductive material is present at a base of the trench in electrical communication with the first electrically conductive structure 3. A switching layer 15 of a conformal material is present in the trench on the first electrode 10, and is present on sidewalls of the trench and extends outside the trench. A second electrode 20 (also referred to as upper or top electrode) is present on the switching layer 15 overfilling the trench 5. A contact 25 is positioned on a portion (i.e., extended portion to the left) of the second electrode 20 that is overfilling the trench to provide that the contact is horizontally offset H1 from the first electrode 10 that is present in the bottom of the trench.

The first electrode 10 is present only at the base of the trench. The first electrode does not extend along the sidewall of the trench upwards from the portion of the first electrode 10 that is present on the base surface of the trench. For example, in one embodiment no portion of the first electrode extends beyond the first ¼ of the height of the trench. This is distinguished from the embodiment that is depicted in FIG. 1, in which the first electrode 10 extends along an entire height of the trench.

It is noted that the embodiment depicted in FIG. 2 includes a number of elements similar to the embodiment that is depicted in FIG. 1. In at least one embodiment, the elements having reference numbers in FIG. 2 may have characteristics of similar elements having the same reference numbers in FIG. 1. Therefore, the description of the elements having reference numbers in FIG. 1 are suitable for providing the description of the characteristics of the elements having the same reference numbers in FIG. 2.

FIGS. 3-8 describe one embodiment of a method for forming the structure depicted in FIG. 1. Broadly, the method of forming the memory device may include forming a trench 5 to an electrically conductive structure that is present at a base of the trench 5. Forming a first electrode 10 (also referred to as lower or bottom electrode) within the trench 5. Filling the trench with a fill including a bilayer 15, 20 comprising of a switching layer 15 that is present on the first electrode 10 and a layer for a second electrode 20 on the switching layer, wherein a portion (e.g., extension portion 21) of the bilayer extends outside of the trench 5. Patterning a portion of the bilayer that extends outside the trench 5 to provide a landing spot that is horizontally offset H1 from the first electrode 10 in the trench 5. Forming a contact 25 to the landing spot.

Figure 3:
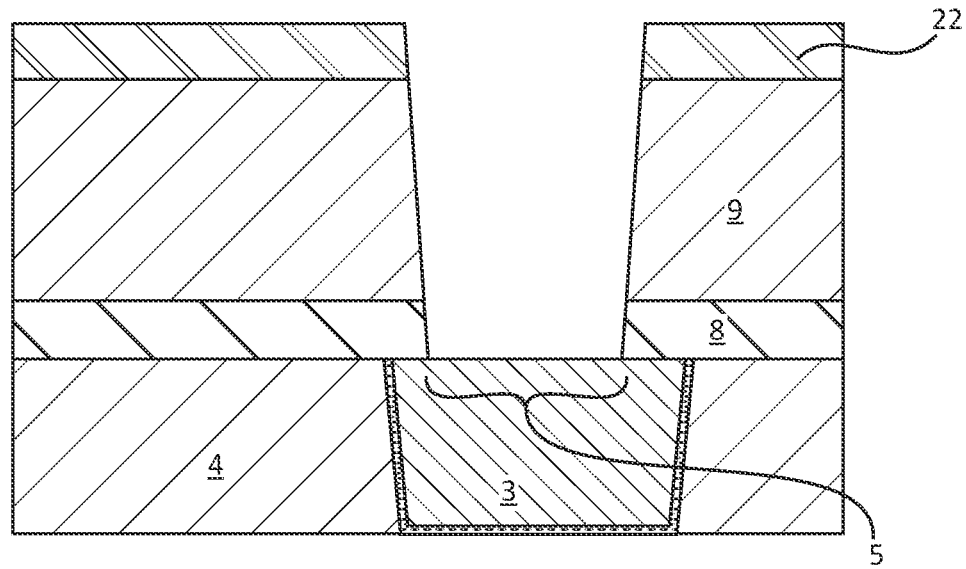
FIG. 3 is a side cross-sectional view illustrating contact hole patterning for an initial structure for a method for forming the structure depicted in FIG. 1, in accordance with one embodiment of the present disclosure.

FIG. 3 illustrates one embodiment of an initial structure for a method for forming the structure depicted in FIG. 1. The initial structure depicted in FIG. 3 includes tall contact hole patterning. More specifically, in one embodiment, the structure depicted in FIG. 3 includes a trench 5 to a first electrically conductive structure or bottom contact 3. The first electrically conductive structure 3 may be an electrically conductive line, e.g., metal line, such as copper (Cu) line, or the first electrically conductive structure 3 may be a metal via, e.g., copper via. The first electrically conductive structure 3 may be present in a dielectric material 4, e.g., a dielectric substrate or dielectric interlevel layer.

The electrically conductive structure 3 may be formed by forming a trench in the dielectric material using photoresist deposition, patterning via lithography, and an etch process that uses the patterned photoresist as an etch mask. Following formation of the trench, the trench may be filled with a metal, such as, but not limited to copper, tungsten, aluminum e.g., by employing an electroplating, chemical vapor deposition or physical vapor deposition process with barrier liner, such as TaN. Thereafter the structure is planarized, e.g., by using chemical mechanical planarization (CMP).

Dielectric layer deposition may be performed atop the planarized surface, which can start with the interface layer having reference number 8. A blanket deposition of a sequence of dielectric materials can provide an interface layer 8, interlevel dielectric layer 9, and planarization stop layer/diffusion barrier layer 22. The deposition process may include chemical vapor deposition (CVD).

Following aforementioned deposition sequence, the trench 5 if formed providing an opening to the first electrically conductive structure 3. The trench 5 may be formed using photolithography and etch processes. For example, a photoresist mask may be formed exposing the portion of the dielectric material layers in which the via opening is to be formed, wherein following formation of the photoresist mask, the via opening may be etched into the first dielectric layer 11 using an etch process, such as reactive ion etch (RIE). The etch process may be timed, or may be selective to the metal of the electrically conductive structure, or the etch process may be terminated upon detection of reaching the electrically conductive structure using end point detection methods.

Figure 4:
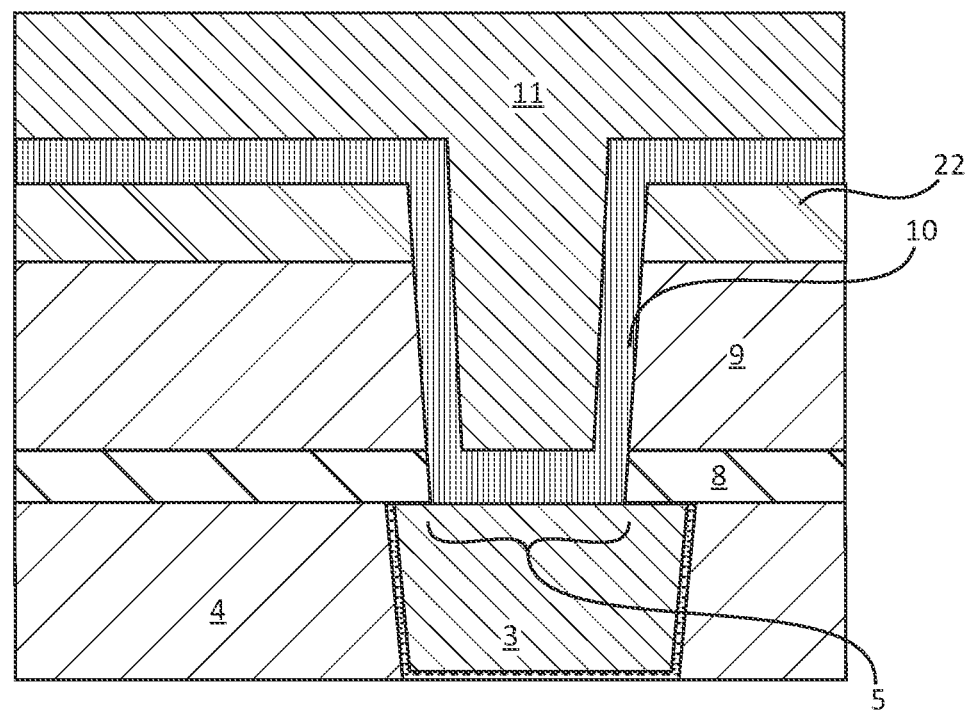
FIG. 4 is a side cross-sectional view that illustrates a blanket deposition of the material layer for the first electrode and the deposition of a sacrificial metal fill for the trench, in accordance with one embodiment of the present disclosure.

FIG. 4 illustrates a blanket deposition of the material layer for the first electrode 10 and the deposition of a sacrificial metal fill 11 for the trench 5. In one embodiment, the material layer for the first electrode 10 may be deposited using a deposition process, such as chemical vapor deposition (CVD), physical vapor deposition (PVD) and/or atomic layer deposition (ALD). The material layer (or material layers) for the first electrode 10 may be formed in direct contact with the electrically conductive structure 3. In one embodiment, the material layer for the first electrode 10 may be composed of tantalum nitride (TaN), and the material layer for the first electrode 10 may be formed by a deposition process that can include chemical vapor deposition (CVD), physical vapor deposition (PVD) and/or atomic layer deposition (ALD). In another embodiment, the material layer for the first electrode 10 may be composed of titanium nitride, and the material layer for the first electrode 10 may include a deposition process that can include chemical vapor deposition (CVD), physical vapor deposition (PVD) and/or atomic layer deposition (ALD). In some embodiments, the first electrode 10 can have a thickness ranging from 5 nm to 200 nm. The blanket deposition of the material layer for the first electrode 10 forms the first electrode material on the base of the trench 5, the sidewalls of the trench and the upper surface of the planarization stop layer/diffusion barrier layer 22.

FIG. 4 also illustrates filling the trench 5 with a sacrificial metal fill 11. In one example, the sacrificial metal fill 11 may be composed of copper (Cu). In some embodiments, the sacrificial metal layer 11 is formed by depositing a copper seed layer followed by a copper fill. The copper fill may be formed using a plating process, e.g., electroplating or electroless plating. In some embodiments, the copper fill for the sacrificial metal fill 11 may overfill the trench 5 extending onto the portions of the material layer for the first electrode 10 that is present on the planarization stop layer/barrier layer 22.

Figure 5:
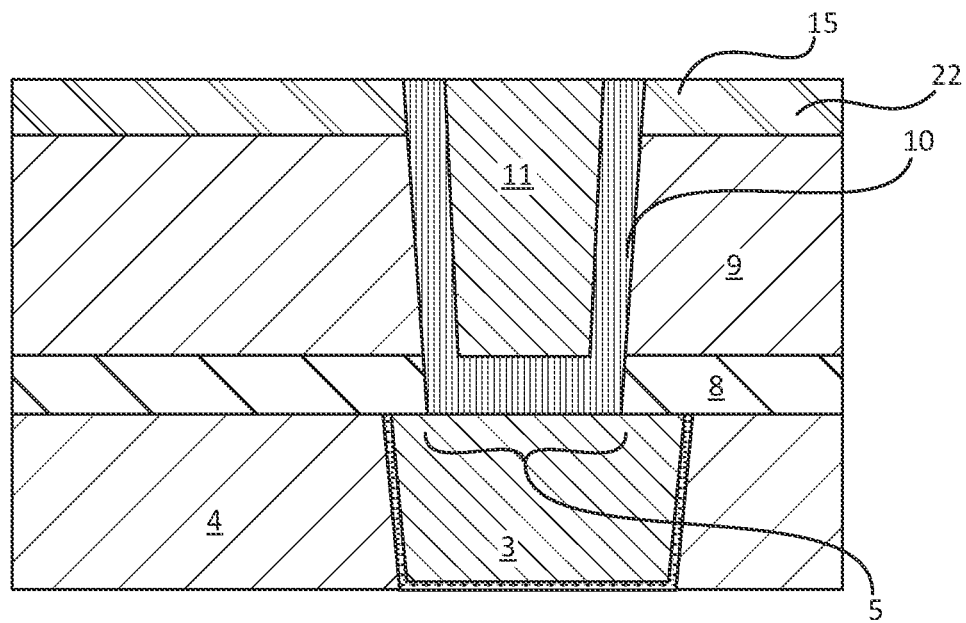
FIG. 5 is a side cross-sectional view illustrating planarizing the structure depicted in FIG. 4, in accordance with one embodiment of the present disclosure.

Referring to FIG. 5 illustrates planarizing the structure depicted in FIG. 4. The planarization method may be provided by chemical mechanical planarization (CMP). The planarization process may be continued to remove all of the sacrificial metal 11 that is not present in the trench 5, and to expose the upper surface of the barrier layer and/or etch stop layer (collectively referred to as interface layer 8).

Figure 6:
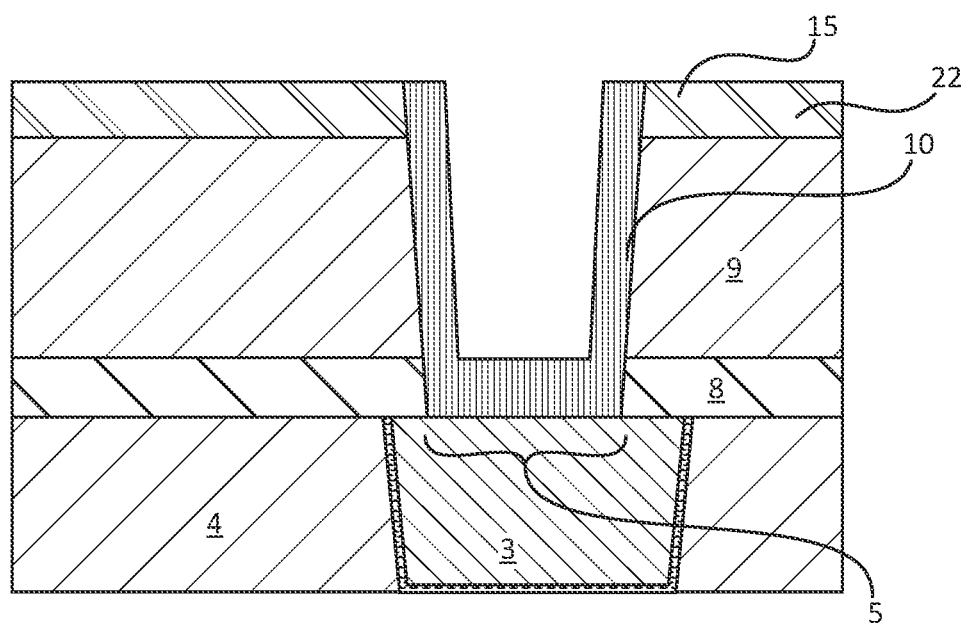
FIG. 6 is a side cross-sectional view illustrating removing the sacrificial metal fill from the trench using an etch process, in accordance with one embodiment of the present disclosure.

The first electrode 10 being contained within the trench 5 following the planarization process defines the portion of the switching device that is processed to be within the trench 5 using a damascene process sequence, i.e., the first electrode 10 is within the damascene, FIG. 6 illustrates one embodiment of removing the sacrificial metal fill 11 from the trench 5 using an etch process. The etch process may be timed, or may be selective to the metal of the first electrode 10, or the etch process may be terminated upon detection of reaching the first electrode using end point detection methods.

Figure 7:
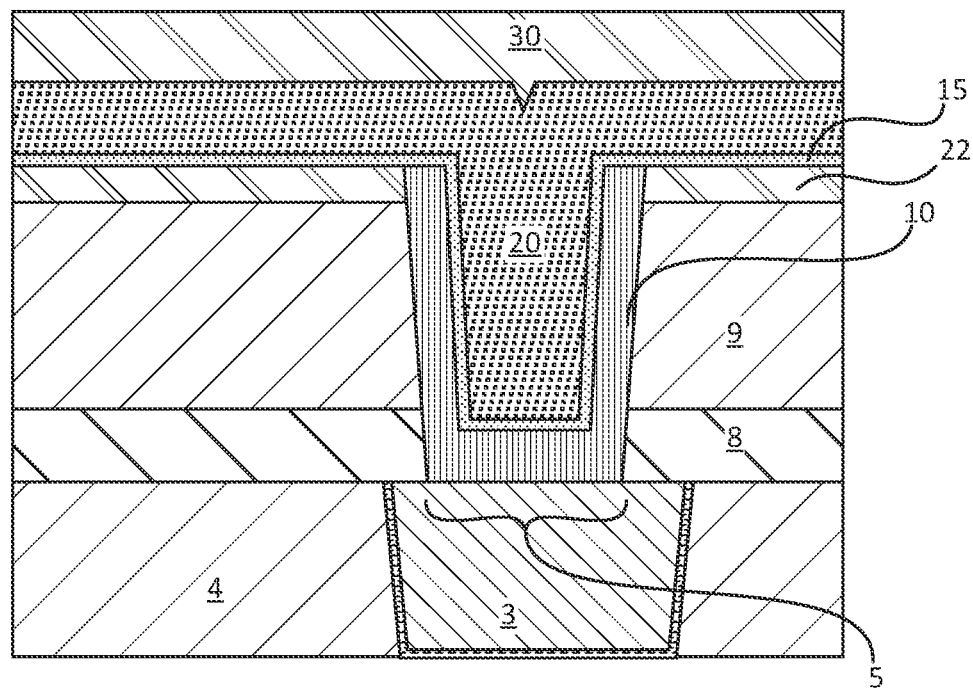
FIG. 7 is a side cross-sectional view illustrating depositing a material layer for the switching layer in the trench, and depositing a material layer for the second electrode, in accordance with one embodiment of the present disclosure.

FIG. 7 illustrates one embodiment of depositing a material layer for the switching layer 15 in the trench 5, and depositing a material layer for the second electrode 20. The switching layer 15 may be blanket deposited on the structure depicted in FIG. 6. The switching layer 15 is deposited into direct contact with the material layer for the first electrode 10. The switching layer 15 may be a metal oxide, which may be deposited using a conformal deposition process. In some embodiments, the switching layer 15 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The switching layer 15 may have a thickness ranging from 1 nm to 15 nm. In one example, the switching layer 15 may be composed of hafnium oxide ($HfO_2$), and may have a thickness ranging from 3 nm to 10 nm.

The switching layer 15 can be formed using atomic layer deposition (ALD). Atomic Layer Deposition (ALD) is a thin film deposition method in which a film is grown on a substrate by exposing its surface to alternate gaseous species (typically referred to as precursors). In contrast to chemical vapor deposition, the precursors in ALD are not present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures. For example, the switching layer 15 can be deposited by atomic layer deposition of $HfO_2$ using subsequent pulsed of $HfCl_4$ and $H_2O$ precursors at temperatures above 200 C.

It is noted that atomic layer deposition (ALD), is only one example of a deposition process for forming the switching layer 15. In some other embodiments, the deposition process may be chemical vapor deposition, such as plasma enhanced chemical vapor deposition (PECVD).

The blanket deposition of the material layer for the switching layer 15 deposits material on the base of the trench 5, the sidewalls of the trench 5, and the upper surface of the planarization stop layer/diffusion barrier layer 22.

FIG. 7 also depicts depositing the material layer for the second electrode 20 (also referred to as upper electrode or top electrode) directly on the switching layer 15. In one embodiment, the second electrode 20 is composed of a titanium nitride (TiN). The titanium nitride (TiN) layer for the second electrode 20 can be deposited using chemical vapor deposition (CVD), such as plasma enhanced chemical vapor deposition (PECVD) or metal organic chemical vapor deposition (MOCVD). In other embodiments, the metal composition for the second electrode 20 may be a titanium aluminum carbon containing material, e.g., titanium aluminum carbon (TiAlC) layer. The thickness of the material layer for the second electrode 20 is deposited directly on the material layer for the switching layer, and may be deposited to a thickness that fills the trench 5

The blanket deposition of the material layer for the second electrode 20 deposits material directly on the switch layer 15 at the base of the trench 5, directly on the switch layer that is present on the sidewalls of the trench 5, and on the portion of the switch layer 15 that is present on the upper surface of the planarization stop layer/diffusion barrier layer 22.

FIG. 7 further illustrates forming a hardmask layer 30 atop the material layer that provides the second electrode 20. The hardmask layer 30 may be composed of a nitride containing dielectric, such as silicon nitride. The hardmask layer 30 may be deposited using chemical vapor deposition (CVD).

Figure 8:
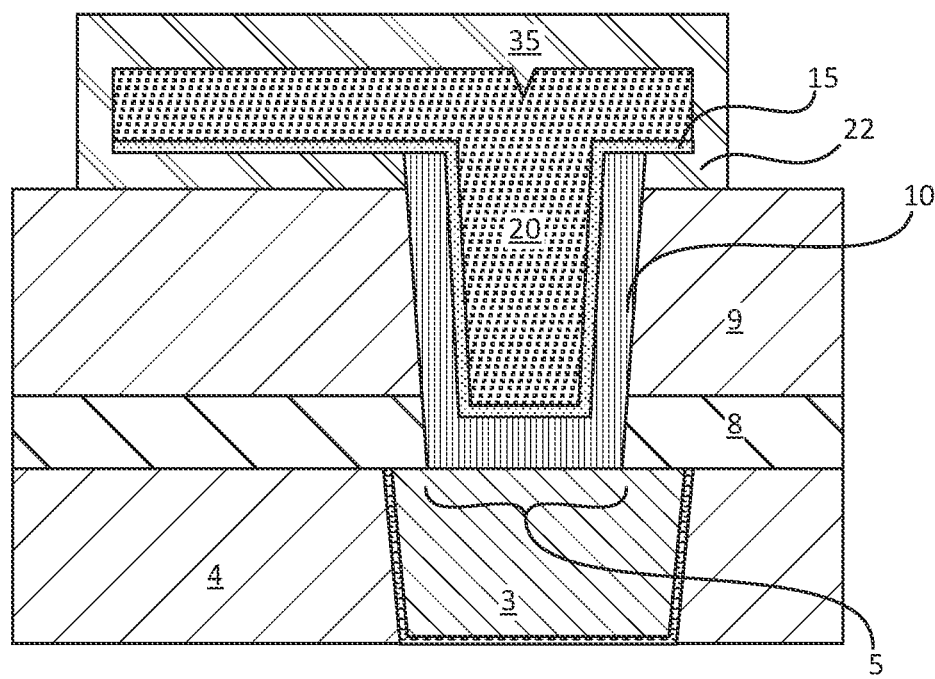
FIG. 8 is a side cross-sectional view illustrating patterning the second electrode and the switching layer and encapsulating the patterned portions of the second electrode and the switching layer in a encapsulating dielectric, in accordance with one embodiment of the present disclosure.

FIG. 8 illustrates patterning the second electrode 20 and the switching layer 15 and encapsulating the patterned portions of the second electrode 20 and the switching layer 15 in a encapsulating dielectric 35, e.g., silicon nitride. Patterning the second electrode 20 and the switching layer 15 may start with forming a photoresist mask on the hardmask layer 30. The photoresist mask covers the portion of hardmask layer 30 and the underlying portions of the second electrode 20 and the switching layer 15 that are intended to remain for encapsulation with the encapsulating dielectric 35. The pattern and etch process sequence also defines the width of the extension portion 21 for the second electrode 20 and the switching layer 15.

Following the formation of the etch mask, the hardmask layer 30 may be etched followed by etching the material layer of the second electrode 20 and the material layer for the switching layer 15. The etch process may be a directional etch, e.g., by reactive ion etching (RIE). The etch process may extend through the material layers for the hardmask layer 30, the second electrode 20, and the switching layer 15, but stops on barrier layer 22.

Referring back to FIG. 1, the method may continue with encapsulating the remaining portions of the first electrode 20 and the switching layer 15 with the encapsulating dielectric 35, e.g., the encapsulating dielectric may be silicon nitride. The encapsulated dielectric may be deposited using any deposition process, such as chemical vapor deposition (CVD), and may be defined using an etch back process.

FIG. 1 also illustrates forming an interlevel dielectric layer 40 and forming a contact 25 (also referred to top contact or upper contact). The interlevel dielectric layer 40 may be composed of a dielectric composition that may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 40 may be deposited using any deposition process, such as chemical vapor deposition (CVD).

FIG. 1 also illustrates forming the trench for the contact 25 to the extension portion 21 of the second electrode 20 and the switching layer 15, which is horizontally offset H1 from the first electrode 10 that is present in the trench 5. The trench for the contact 25 may be etched into the top interlevel dielectric layer 40 by forming a photoresist mask on the top interlevel dielectric layer 40 using deposition and photolithography processes to form an etch mask having a geometry for the trench for the contact 25. Following formation of the photoresist mask, the exposed portion of the top interlevel dielectric layer 40 may be etched using an etch process, such as an anisotropic etch process, e.g., reactive ion etching (RIE), to expose an upper surface of the second electrode 20 and provide the opening for the contact 25.

The opening for the trench may then be filled with a metal for the contact 25. For example, the metal for the contact may be copper (Cu). To deposit a copper seed layer followed by a copper fill. The copper fill may be formed using a plating process, e.g., electroplating or electroless plating. In some embodiments, the copper fill for the contact 25 may overfill the trench. The portion of the copper fill that overfills the trench may be removed using a planarization process. The planarization method may be provided by chemical mechanical planarization (CMP). The contact 25 can be also tungsten or aluminum with a proper liner metal layer.

Figure 9:
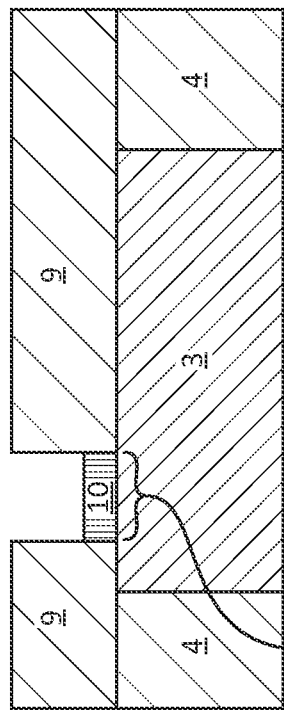
FIG. 9 is a side cross-sectional view illustrating an initial structure for forming the memory device depicted in FIG. 2.

FIGS. 9-12 illustrate some process steps for providing the memory device depicted in FIG. 2. FIG. 9 illustrates an initial structure for forming the memory device 100 depicted in FIG. 2. The initial structure includes a trench 5 that extends through an interlevel dielectric layer 9 and exposes the surface of an electrical communication structure 3 that is present in a separate layer, e.g., dielectric material 4. The dielectric layer 9 can contain diffusion barrier layer 8. It is noted that each of the elements having a reference number depicted in FIG. 9 has been described in the previous embodiment described above with reference to FIGS. 1-8, in which elements having the same reference numbers may share the same descriptions.

Figure 10:
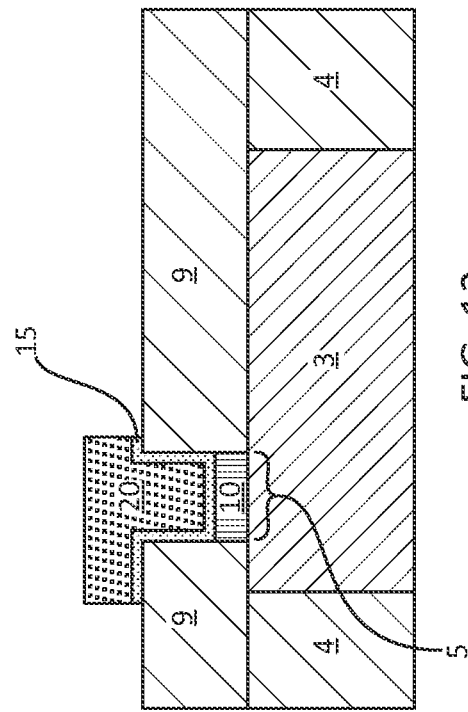
FIG. 10 is a side cross-sectional view illustrating forming a first electrode at the base of the trench depicted in FIG. 9, in accordance with one embodiment of the present disclosure.

FIG. 10 illustrates forming a first electrode 10 at the base of the trench depicted in FIG. 9. The first electrode 10 is formed using selective area deposition. Area selective deposition, which may also be referred to area selective atomic layer deposition (ALD) may be employed to provide that the electrically conductive material for the first electrode 10, e.g., a metal and/or metal nitride, such as tantalum nitride (TaN) or titanium nitride (TiN), is deposited only at the baes of the trench 5, i.e., the material for the first electrode 10 does not extend upwards along the sidewall S1 of the trench 15.

Figure 11:
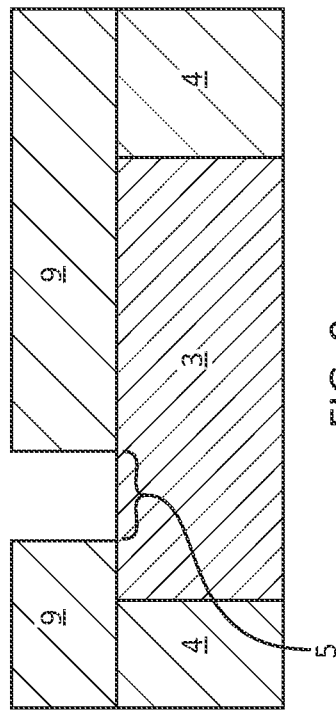
FIG. 11 is a side cross-sectional view illustrating forming the material layers for the switching layer and the second electrode on the first electrode that is depicted in FIG. 10.

FIG. 11 illustrates forming the material layers for the switching layer 15 and the second electrode 20 on the first electrode 10 that is depicted in FIG. 10. It is noted that each of the elements having a reference number depicted in FIG. 11 has been described in the previous embodiment described above with reference to FIGS. 1-8, in which elements having the same reference numbers may share the same descriptions. One difference from the embodiment illustrated in FIGS. 1-8, and the embodiment illustrated in FIG. 11 is that in the embodiment depicted in FIG. 11, the switching layer 15 is formed on direct contact with the sidewalls S1 of the trench 5.

Figure 12:
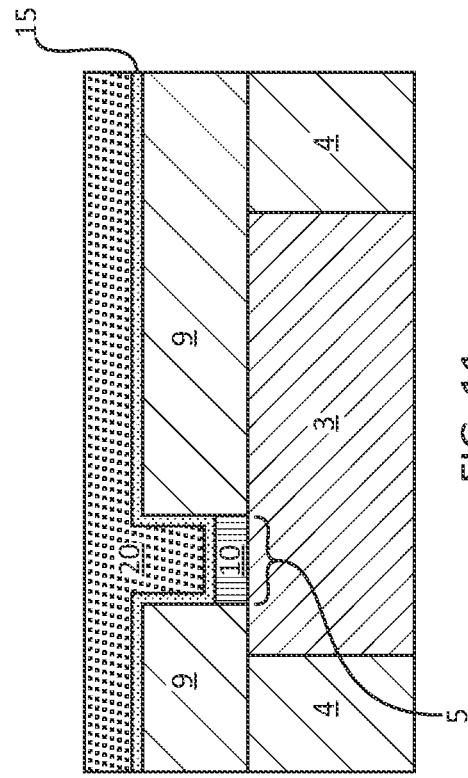
FIG. 12 is a side cross-sectional view illustrating patterning the second electrode and the switching layer, in accordance with one embodiment of the present disclosure.

FIG. 12 illustrates one embodiment of patterning the second electrode 20 and the switching layer 15. The method step illustrated in FIG. 12 has been described above with reference to FIG. 8. Further, the processing for the structure depicted in FIG. 12 to the structure illustrated in FIG. 2 has also been described above in the descriptions of FIG. 8 and FIG. 1. It is noted that some elements that have been described in FIGS. 1-8 are not illustrated in the embodiments described in illustrated in FIGS. 2 and 9-12. However, although they are not depicted, they may be present, as some elements may have been omitted in FIGS. 2 and 9-12 for the purposes of simplicity and brevity.

Having described preferred embodiments of a top contact on resistive random access memory (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory device comprising:
   a trench to a first electrically conductive structure;
   a first electrode of a conformal electrically conductive material contained within the trench in electrical communication with the first electrically conductive structure and is present on sidewalls of the trench;
   a switching layer is present in the trench on the first electrode and extends outside the trench;
   a second electrode present on the switching layer overfilling the trench; and
   a contact positioned on a portion of the second electrode that is overfilling the trench to provide that the contact is horizontally offset from the first electrode that is present in the trench.

2. The memory device of claim 1, wherein the memory device is a resistive random access memory (ReRAM).

3. The memory device of claim 1, wherein the first electrode has a U-shaped geometry when viewed from a side cross-section.

4. The memory device of claim 1, wherein an upper surface of the first electrode that is present on the sidewalls of the trench is coplanar with the upper surface of the trench.

5. The memory device of claim 1, wherein the switching layer has a composition selected from the group consisting of hafnium oxide (HfO2), tantalum oxide (Ta2O5), titanium oxide (TiO2), tungsten oxide (WO3), zirconium oxide (ZrO2), aluminum oxide (Al2O3), strontium titanium oxide (SrTiO3) and combinations thereof.

6. The memory device of claim 1, wherein a portion of the switching layer extends outside the trench, and a portion of the second electrode overfilling the trench provide an extension portion of the switching layer and second electrode for a landing point for the contact.

7. A memory device comprising:
   a trench to a first electrically conductive structure;
   a first electrode of an electrically conductive material present at a base of the trench in electrical communication with the first electrically conductive structure;
   a switching layer of a conformal material present in the trench on the first electrode, the switching layer present on sidewalls of the trench and the switching layer extending outside the trench;
   a second electrode is present on the switching layer overfilling the trench; and
   a contact positioned on a portion of the second electrode that is overfilling the trench to provide that the contact is horizontally offset from the first electrode that is present in the trench.

8. The memory device of claim 7, wherein the memory device is a resistive random access memory (ReRAM).

9. The memory device of claim 7, wherein no portion of the first electrode extends beyond the first ¼ of the height of the trench.

10. The memory device of claim 7, wherein the switching layer is in direct contact with the sidewalls of the trench.

11. The memory device of claim 7, wherein the switching layer has a composition selected from the group consisting of hafnium oxide (HfO2), tantalum oxide (Ta2O5), titanium oxide (TiO2), tungsten oxide (WO3), zirconium oxide (ZrO2), aluminum oxide (Al2O3), strontium titanium oxide (SrTiO3) and combinations thereof.

12. The memory device of claim 7, wherein a portion of the switching layer extends outside the trench, and a portion of the second electrode overfilling the trench provide an extension portion of the switching layer and second electrode for a landing point for the contact.

* * * * *